US008216773B1

(12) United States Patent
Delgado

(10) Patent No.: US 8,216,773 B1
(45) Date of Patent: Jul. 10, 2012

(54) BROADBAND PLASMA LIGHT SOURCES FOR SUBSTRATE PROCESSING

(75) Inventor: Gildardo R. Delgado, Livermore, CA (US)

(73) Assignee: KLA-Tencor Corporation, Milpitas, CA (US)

(*) Notice: Subject to any disclaimer, the term of this patent is extended or adjusted under 35 U.S.C. 154(b) by 129 days.

(21) Appl. No.: 12/693,381

(22) Filed: Jan. 25, 2010

Related U.S. Application Data

(62) Division of application No. 11/224,921, filed on Sep. 12, 2005, now Pat. No. 7,652,430.

(51) Int. Cl.
*G03F 7/20* (2006.01)

(52) U.S. Cl. ........................................ 430/322; 430/311

(58) Field of Classification Search .................. 430/311, 430/322

See application file for complete search history.

(56) References Cited

U.S. PATENT DOCUMENTS

| | | | |
|---|---|---|---|
| 2,716,713 | A | 8/1955 | Noel |
| 3,449,615 | A | 6/1969 | Tucker et al. |
| 4,069,416 | A | 1/1978 | Suga |
| 4,443,734 | A | 4/1984 | Gross et al. |
| 4,636,685 | A | 1/1987 | Skeist et al. |
| 4,743,802 | A | 5/1988 | Connor et al. |
| 5,886,478 | A | 3/1999 | Smith et al. |
| 6,121,730 | A | 9/2000 | Ukegawa et al. |
| 6,288,780 | B1 | 9/2001 | Fairley et al. |
| 6,664,733 | B2 | 12/2003 | Harada et al. |
| 6,703,771 | B2 | 3/2004 | Becker et al. |
| 6,816,249 | B2 | 11/2004 | Fairley et al. |
| 6,858,988 | B1 | 2/2005 | Laroussi |
| 7,279,839 | B2 | 10/2007 | Menzel et al. |
| 7,652,430 | B1 | 1/2010 | Delgado |
| 2002/0027419 | A1 | 3/2002 | Harada et al. |
| 2003/0001503 | A1 | 1/2003 | Higashimoto et al. |
| 2004/0222743 | A1 | 11/2004 | Takagi et al. |
| 2005/0035711 | A1 | 2/2005 | Spielman et al. |
| 2005/0104521 | A1 | 5/2005 | Berndanner et al. |
| 2005/0194904 | A1 | 9/2005 | Hosoya et al. |
| 2008/0127895 | A1 | 6/2008 | Shao et al. |

OTHER PUBLICATIONS

"Principles of Electronic Packaging" Donald Seraphim, ed. 1989, pp. 374-376.*

E. Casado et al., "An Experimental Study of the Dependence on the Current Intensity of the Erosion of Thoriated Tungsten Cathodes in Plasma Arcs" in IEEE Transactions on Plasma Science, vol. 29 No. 6, pp. 888-894, Dec. 2001.

J. Haidar et al. "Surface Temperature Measurements for Tungsten-Based Caothodes of High-Current Free-Burning Arcs" in J. Phys D: Appl. Phys 28 pp. 2089-2094, (1995).

Energetiq EQq-10M EUV Source Product Description, Energetiq Technology, Inc. Woburn, MA, Jun. 2005.

R. Mills et al. "Spectroscopic Identification of Fractional Rydberg States of Atomic Hydrogen Formed by a Catalytic Helium-Hydrogen Plasma Reaction" Jul. 22, 2002.

U.S. Appl. No. 60/698,452, filed Jul. 11, 2005.

"Configured—Definition form the Merriam-Webster Online Dictionary", http://www.merriam-webster .com/dictionary/configured, downloaded on Feb. 11, 2009.

"Flash lamp—Definition from the Merriam-Webster Online Dictionary", http://www.merriam-webster .com/dictionary/flash%20lamp, downloaded on Feb. 11, 2009.

"Maintain—Definition from the Merriam-Webster Online Dictionary", http://www.merriam-webster.com/dictionary/maintain, download on Feb. 11, 2009.

Non-final Office Action dated Nov. 13, 2008 for U.S. Appl. No. 11/224,921.

Final Office Action dated May 11, 2009 for U.S. Appl. No. 11/224,921.

I. Kanik, "Far Ultraviolet Emission Spectrum of Xenon induced by Electron Impact at 100eV", Aug. 16, 1996—Chemical Physics Letters, vol. 258, Issues 3-4, pp. 455-459.

Notice of Allowance and Fee(s) Dues dated Oct. 9, 2009 for U.S. Appl. No. 11/224,921.

* cited by examiner

*Primary Examiner* — Kathleen Duda

(74) *Attorney, Agent, or Firm* — Joshua D. Isenberg; JDI Patent

(57) ABSTRACT

Broadband radiation may be generated by supplying a gas mixture containing hydrogen and/or deuterium and/or helium and/or neon to an enclosure, generating a plasma inside the enclosure with the gas mixture. Broadband radiation generated as a result of the plasma discharge to a substrate may be optically coupled to a substrate located outside the enclosure.

13 Claims, 4 Drawing Sheets

BROADBAND PLASMA LIGHT SOURCES FOR SUBSTRATE PROCESSING

CROSS-REFERENCE TO A RELATED APPLICATION

This application is a divisional of and claims the priority benefit of commonly-assigned, co-pending U.S. patent application Ser. No. 11/224,921 filed Sep. 12, 2005, the entire disclosures of which are incorporated herein by reference.

This application claims the priority benefit of the provisional patent application Ser. No. 60/698,452 filed Jul. 11, 2005, the entire disclosures of which are incorporated herein by reference.

FIELD OF THE INVENTION

This invention generally relates to plasma sources and more particularly to plasma sources used as broadband light sources in substrate processing.

BACKGROUND OF THE INVENTION

Broadband ultraviolet light sources are used for various applications in the semiconductor processing industry. These applications include wafer inspection systems and lithography systems. In both types of systems it is desirable for the light source to have a long useful lifetime, high brightness and a broad spectral range of emitted light. Currently plasma-based light sources are used in lithography and wafer inspection systems. Plasma-based light sources generally include an enclosure containing a cathode, an anode and a discharge gas, e.g., argon, xenon, or mercury vapor or some combination of these. A voltage between the cathode and anode maintains a plasma or electric arc.

Prior art plasma light sources suffer from a number of drawbacks when used in lithography and inspection systems. The first drawback, common to both types of systems is that plasma light sources based on mercury and/or argon and/or Xenon have a limited amount of emission in the deep UV. It would be desirable to increase the amount of emission at vacuum wavelengths below about 260 nanometers. Unfortunately, mercury emission tends to die off rapidly at below 260 nanometers. Another drawback that is particularly relevant to wafer inspection systems is that the discharge tends to rapidly degrade. Wafer inspection systems collect light from the plasma over a relatively narrow solid angle and therefore require tight confinement of the plasma arc between the cathode and anode. Unfortunately, as the source ages, the cathode tends to erode and/or become contaminated and the arc tends to spread.

Thus, there is a need in the art, for a broadband plasma light source that overcomes the above disadvantages.

SUMMARY OF THE INVENTION

An embodiment of the invention relates to a method for exposing a substrate to broadband radiation. A gas mixture containing hydrogen and/or deuterium and/or helium and/or neon is supplied to an enclosure and a plasma is generated inside the enclosure with the gas mixture. Radiation generated as a result of the plasma discharge is optically coupled to a substrate located outside the enclosure. Examples of this embodiment are particularly useful for wafer inspection and lithography.

Another embodiment of the invention relates to a substrate processing system. The system includes a discharge lamp including an enclosure having one or more walls, at least one of which is at least partly transparent. A gas mixture contained within the enclosure includes hydrogen and/or deuterium gas. A plasma discharge mechanism is adapted to maintain a plasma discharge of the gas mixture within the enclosure. A substrate support is located outside the discharge lamp. Optics are adapted to couple radiation from the discharge lamp to a substrate located on the substrate support.

An additional embodiment of the invention relates to a broadband light source. The light source includes an enclosure having one or more walls, at least one of which is at least partly transparent. A gas mixture that includes hydrogen and/or deuterium gas is contained within the enclosure. A total pressure of the gas mixture is between about 1 atmosphere and about 15 atmospheres. A partial pressure of hydrogen and/or deuterium in the gas mixture is between about 1 percent and about 10 percent of the total pressure. A plasma discharge mechanism is adapted to maintain a plasma discharge of the gas mixture within the enclosure.

Additional embodiments of the invention are directed to high purity light sources and substrate processing systems using such light sources. Such high-purity light sources may achieve low levels of contaminants through the use of gas mixtures, enclosures and discharge mechanisms adapted for UHV-compatible operation.

Embodiments of the present invention allow for broader band emission highly stable and longer lasting discharge sources.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the present invention, a substrate may be exposed to broadband radiation by supplying a gas mixture containing hydrogen and/or deuterium to an enclosure, generating a plasma inside the enclosure with the gas mixture, and optically coupling ultraviolet light generated as a result of the plasma discharge to a substrate located outside the enclosure.

Figure 1:
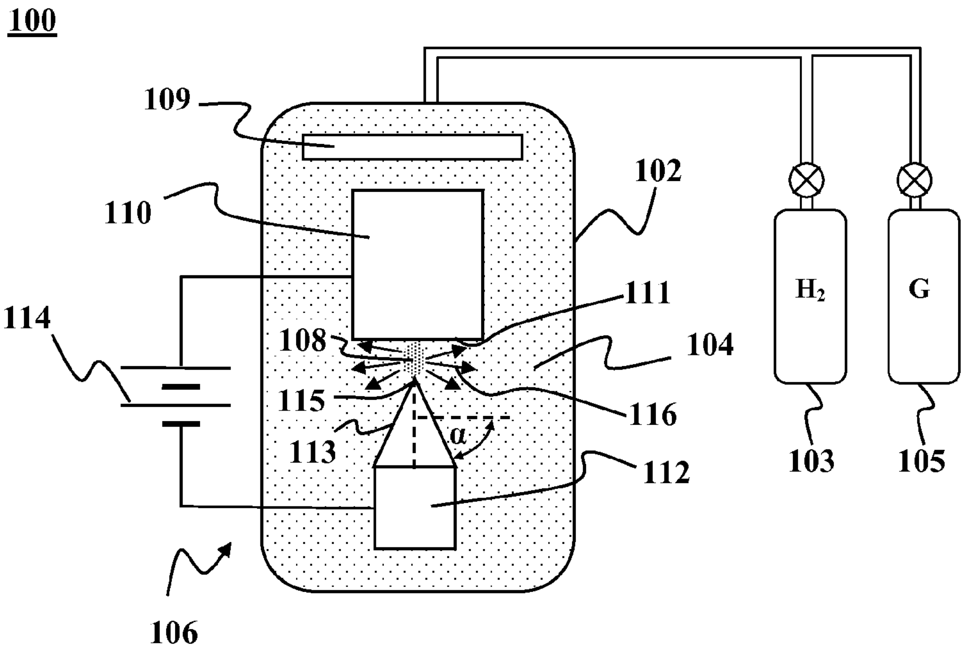
FIG. 1 is a schematic diagram of an ultraviolet discharge lamp according to an embodiment of the present invention.

FIG. 1 illustrates an example of a broadband light source 100 according to an embodiment of the invention. The broadband light source 100 generally includes an enclosure 102 having one or more walls. At least one of the walls of the enclosure 102 is at least partly transparent. By way of example and without limitation of the invention, a transparent portion of the walls of the enclosure 102 may be made of quartz or fused silica. A gas mixture 104 is contained within the enclosure 102. As used herein, the term "enclosure" refers to a closed environment having one or more walls that contain the gas mixture 104 while preventing the ambient atmosphere from undesirably contaminating the gas mixture 104. The gas mixture 104 includes hydrogen and/or deuterium and/or helium and/or neon gas although other gases, such as argon, xenon, nitrogen, neon or mercury vapor among others may also be present.

Preferably, a total pressure of the gas mixture 104 is between about 1 atmosphere and about 15 atmospheres, more preferably, between about 6 atmospheres and about 12 atmospheres. A partial pressure of hydrogen and/or deuterium in the gas mixture 104 is between about 1 percent and about 10 percent of the total pressure. A getter 109 may be placed within the enclosure 102 to remove impurities during operation of the lamp 100. Examples of suitable getters are available from SAES Pure Gas Inc.

A plasma discharge mechanism 106 is adapted to maintain a plasma discharge 108 of the gas mixture 104. The plasma discharge 108 takes place within the enclosure 102. Gas pressure in the ranges set forth above are desirable in order to obtain intense radiation of ultraviolet light from the discharge 108 suitable for use in substrate processing systems such as wafer inspection or lithography systems.

There are a number of gas combinations that may be used in the gas mixture 104. For example, the gas mixture 104 may be a mixture of argon with hydrogen and/or deuterium and/or helium and/or neon and or nitrogen gas. Alternatively, the gas mixture 104 may be a mixture of mercury vapor and hydrogen and/or deuterium gas. Furthermore, the gas mixture 104 may be a mixture of xenon and hydrogen and/or deuterium gas. Gas sources 103, 105 may supply hydrogen/deuterium and other gases for the gas mixture 104 to the enclosure 102 through a network of tubes and valves. Hydrogen plasmas are known to be relatively difficult to ignite. The relatively low partial pressure of hydrogen is desirable to facilitate ignition of the plasma discharge 108 with a conventional igniter (not shown) used in high pressure gas discharge lamps. A tesla coil igniter may be used to facilitate ignition of the gas mixture 104 to form the discharge 108. In some embodiments of the invention, the discharge 108 may be ignited in a conventional broadband gas discharge lamp (i.e., without hydrogen and/or deuterium in the gas mixture) using a standard argon, xenon or mercury vapor gas mixture. Hydrogen and/or deuterium may then be subsequently added to the discharge gas mixture 104 while maintaining the discharge 108. To avoid the introduction of impurities that might degrade the discharge 108 it is desirable that the gases used in the discharge gas mixture 104 be very highly pure, e.g., with impurities being in the range of a few parts-per-billion or less.

Figure 7:
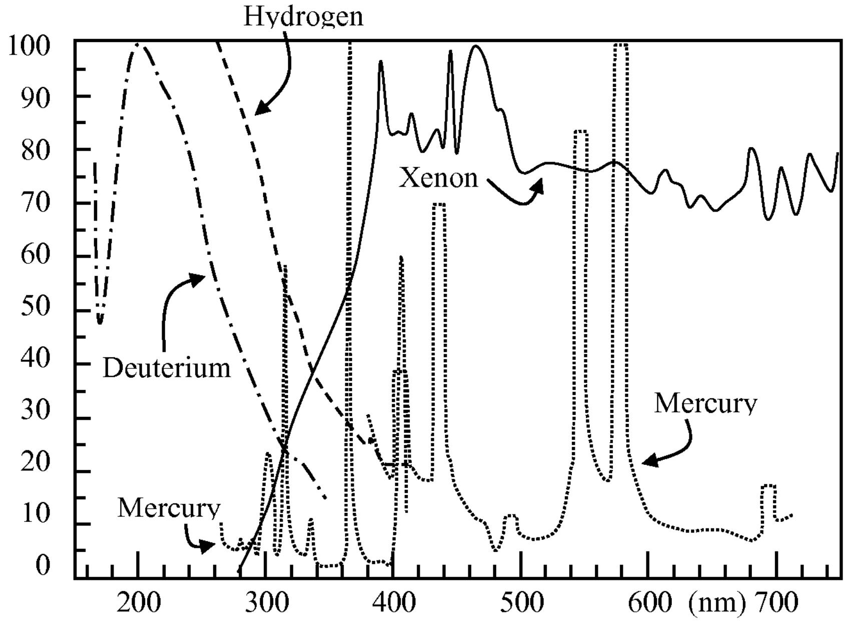
FIG. 7 is a spectral diagram illustrating spectral emission for certain gases as functions of wavelength.

The combination of gases in the gas mixture 104 affects the wavelengths of radiation emitted by the discharge 108. In preferred embodiments of the invention, it is desirable that the discharge 108 emit radiation of vacuum wavelengths that range from about 150 nanometers to about 700 nanometers and more particularly from about 190 nanometers to about 450 nanometers. Vacuum wavelengths below about 190 nm are also of interest. By way of example and without loss of generality, xenon emits broadband radiation from about 300 nanometers (in the ultraviolet) to wavelengths in the infrared portion of the electromagnetic spectrum. Argon emits at about 488 nanometers. Hydrogen gas $H_2$ has continuous emission from about 160 nanometers to about 400 nanometers. Deuterium gas $D_2$ emits from 180 nanometers to about 360 nanometers. Combinations of xenon and $H_2$ are expected to provide a broad band spectrum from about 160 nm to about 700 nm Combinations of $H_2$ and argon are expected to produce a broad band spectrum ranging from about 160 nm to about 490 nm as illustrated in the spectral diagram of FIG. 7.

In the example depicted in FIG. 1, the plasma discharge mechanism 106 includes an anode 110 spaced apart from a cathode 112. The anode 110 and cathode 112 are disposed within the enclosure 102. A power supply 114 applies a DC or AC voltage between the anode 110 and cathode 112. The voltage produces an electric field that maintains the discharge 108. The discharge produces broad band radiation 116. The power supply 114 may apply a pulse of high voltage between the anode 110 and cathode 112 sufficient to ionize some of the gas mixture 104 to ignite the discharge 108.

In this example, the anode 110 is in the shape of a cylinder with a flat surface 111 and the cathode 112 includes a cone-shaped portion 113. The flat surface 111 of the anode 110 is disposed proximate an apex 115 of the cone-shaped portion 113. A cone angle $\alpha$ of the cone-shaped portion 113 is greater than about 30°. As used herein, the cone angle $\alpha$ is measured between a surface of the cone-shaped portion 113 and a line perpendicular to a symmetry axis of the cone-shaped portion 113 as shown in FIG. 1. It is desirable for the apex 115 of the cone-shaped portion 113 of the cathode 112 to be spaced apart from the flat surface 111 of the anode 110 by a distance of between about 2 millimeters and about 5 millimeters.

The entire cathode 112 as well as the anode 110 may be made of tungsten. Preferably, at least the cone-shaped portion of the cathode 112 is made of tungsten. The tungsten used in the cathode 112 may be coated with carbon to for tungsten carbides ($W_2C$ or WC, or other tungsten carbides) or the coat can also be graphitized carbon to enhance electron emission from the cathode tip 112. The tungsten used in the cathode 112 may be doped with a dopant selected to enhance electron emission from the cathode 112. Examples of suitable dopants include, but are not limited to, thorium oxide ($ThO_2$), barium oxide (BaO), lanthanum, lanthanum oxide ($La_2O_3$) lanthanum hexaboride ($LaB_6$), calcium oxide (CaO), alumina ($Al_2O_3$), scandium oxide ($Sc_2O_3$), combinations of $Sc_2O_3$ and BaO, iridium, cerium, cerium oxide ($CeO_2$), cesium (Cs), zirconium oxide ($ZrO_2$), hafnium oxide ($HfO_2$), silicon (Si), aluminum, and potassium (K). In addition, the following materials may be used for at least the cone-shaped portion of the cathode 112: BaO, $LaB_6$, BaO, CaO, and $Al_2O_3$ in a 4:1:1 $Sc_2O_3$ combinations of $Sc_2O_3$ and BaO, Ir, La, $La_2O_3$, Ce, $CeO_2$, and Cs.

It is desirable that the internal parts of the discharge source 100 e.g., the interior walls of the enclosure 102, the anode 110 and cathode 112 be cleaned to UHV standards using pre-clean, pre-bake procedures known in the art. After assembly, it is desirable to flush these internal components with ultra high purity (e.g., to within parts-per-trillion) argon.

The presence of hydrogen and/or deuterium in the plasma discharge 108 is believed to have two beneficial effects. First, the hydrogen emission spectrum includes radiation below 260 nanometers, a range in which the emission spectrum of mercury vapor typically starts to die out. Thus, the presence of hydrogen in the discharge 108 broadens the spectrum of radiation 116. Hydrogen and deuterium are also relatively light gas molecules and in the discharge 108 these molecules would travel at higher speeds and would therefore have higher temperatures and undergo a higher rate of collision than heavier gas atoms or molecules within the discharge 108. As such, emission due to the presence of hydrogen and deuterium is expected to be brighter than with, say, a pure argon discharge.

In addition, the presence of hydrogen is believed to reduce the degradation of the anode 110 and cathode 112 thereby providing a longer useful life to the light source 100. In the case of tungsten based cathodes 112 the inventor has determined that that the plasma discharge process produces compounds of tungsten with oxygen and/or carbon that have low melting points. Formation of these compounds would lead to erosion of the cathode and formation of deposits on the anode which would degrade the performance of the light source 100. It is believed that the presence of hydrogen and/or deuterium in the gas mixture 104 reduces the production of these compounds on the cathode surface and would thereby extend the useful light of the light source 100. This is counterintuitive since hydrogen gas has been known to cause cathode erosion in discharge sources.

Although gas discharge light sources of the type depicted in FIG. 1 are commercially manufactured, they are not known to use hydrogen or deuterium gas in the gas mixture. Examples of similar light sources that use an argon or mercury vapor gas mixture are available, e.g., from Osram GmbH of Munich, Germany.

Figure 2:
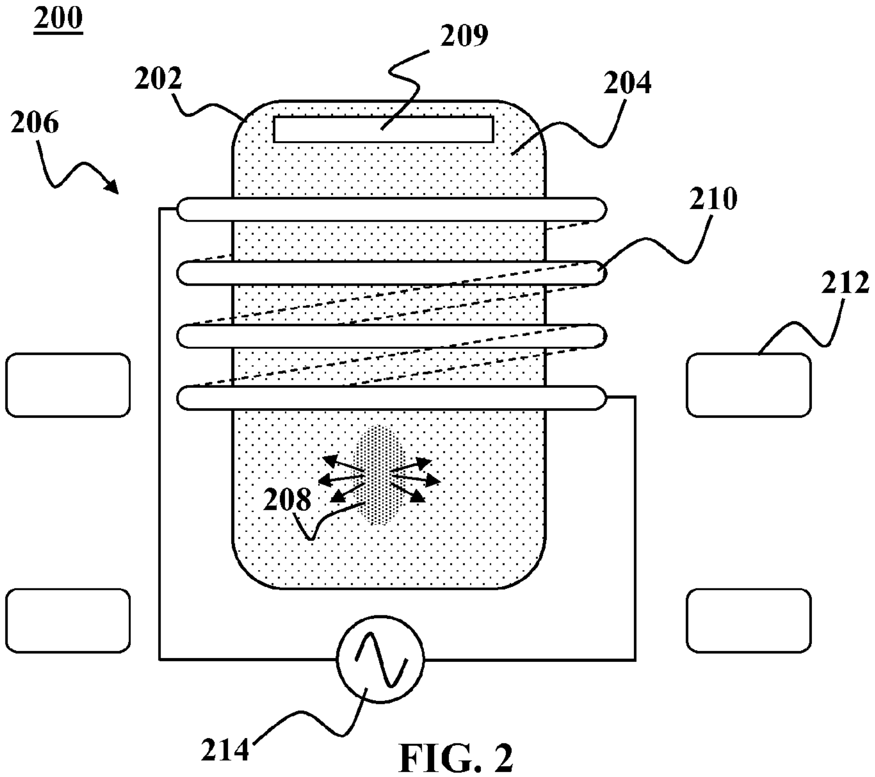
FIG. 2 is a schematic diagram of an ultraviolet discharge lamp according to an alternative embodiment of the present invention.

An alternative broadband light source 200 is depicted in FIG. 2. The broad band light source 200 generally includes an enclosure 202 having one or more walls. At least one of the walls is at least partly transparent. By way of example and without limitation of the invention, a transparent portion of the walls of the enclosure 202 may be made of quartz or fused silica. A gas mixture 204 is contained within the enclosure 202. The gas mixture 204 includes hydrogen and/or deuterium gas although other gases, such as argon, xenon or mercury vapor among others may also be present. Preferably, a total pressure of the gas mixture 204 is between about 1 atmosphere and about 15 atmospheres, more preferably, between about 6 atmospheres and about 12 atmospheres. A partial pressure of hydrogen and/or deuterium in the gas mixture 204 is between about 1 percent and about 10 percent of the total pressure. A number of different gas combinations may be used in the gas mixture 204. For example, argon with hydrogen and/or deuterium gas, mercury vapor with hydrogen and/or deuterium and/or helium and/or neon and/or nitrogen gas or xenon with hydrogen and/or deuterium and/or helium and/or neon and/or nitrogen gas may be used as the gas mixture 204. A getter 209 may be disposed within the enclosure 202 to reduce impurities during operation.

A plasma discharge mechanism 206 is adapted to maintain a plasma discharge 208 of the gas mixture 204. The plasma discharge 208 takes place within the enclosure 202. In the example depicted in FIG. 2, the plasma discharge mechanism 206 utilizes no electrodes within the enclosure 202. Instead one or more induction coils 210 are placed outside the enclosure 202. One or more magnets 212 (e.g., permanent magnets or electromagnets) provide a z-pinch or RF type magnetic field that confines the plasma discharge 208 to a small volume within the enclosure 202. A radiofrequency (RF) power supply 214 provides an RF signal to the coil 210. Electromagnetic energy inductively coupled from the coil 210 to the plasma discharge 208 maintains the plasma discharge 208. Because there is no cathode or anode within the enclosure 202 problems associated with cathode degradation do not arise. The RF power supply 214 may apply a pulse of high power RF energy to the gas mixture 204 sufficient to ionize some of the gas mixture 204 and ignite the discharge 208.

Although inductively coupled discharge light sources are commercially available, e.g., a model EQ-10M Electrodeless Z-Pinch EUV Source from Energetiq of Woburn, Mass., they are not known to use hydrogen and/or deuterium in the discharge gas. As discussed above, the discharge 208 may be ignited in a conventional discharge lamp without hydrogen or deuterium in the gas mixture 204. Hydrogen and/or deuterium may then be subsequently added while maintaining the gas discharge 208.

As part of the work on this invention, the inventor has identified tungsten carbides and tungsten oxide compounds in large fractions as well as other contaminants on the cathode tip. These compounds have significantly lower melting points compared to pure tungsten. Consequently, the presence of these compounds in the cathode tip can result in faster erosion rates an also cause a high rate of burn-back. High erosion rates can also cause the plasma source to be unstable and may also cause the plasma source to spread. These effects can increase the source size and reduce usable life of the lamp. Current lamps inherently have high impurity levels (very high parts-per-million). Therefore, embodiments of the present invention include high purity lamps having very low levels of contaminants, e.g., ranging from parts-per-billion (ppb) to parts-per-trillion (ppt) levels.

In certain embodiments of the present invention it is desirable for the components of the lamp including the enclosure, gas mixture and discharge mechanism (to the extent it is within the enclosure and exposed to the gas) to be of high purity, i.e., compatible with ultra high vacuum (UHV) processing. UHV-compatible components generally produce a vapor pressure of undesirable impurities (e.g., carbon, oxygen, water vapor, etc.) that is less than some threshold, e.g., about a few parts-per-billion (ppb) or better, during lamp operation. There are a number of general guidelines for handling UHV-compatible components. For example, the lamp components (e.g., anode, cathode, glass, getter material and metals or alloys used for attaching anode and cathodes to bases) may be vacuum annealed at a pressure of less than about $10^{-3-}$ millibars, preferably less than about $10^{-7}$ millibars. Annealing is preferably done at temperatures at least 350° C. and more preferably greater than about 1000° C. The duration of time of annealing depends on temperature. For example, when annealing at temperatures above 1000° C., it is recommended a minimum of about 2 hours at temperature.

It is desirable to handle all UHV-compatible lamp components with appropriate gloves. For example, clean room gloves can be thoroughly rinsed with isopropyl alcohol (IPA) before handling components that have been vacuum annealed. Furthermore, it is desirable that all components be stored appropriately. For example, all lamp components (glass, anode, cathode, etc) may be sealed into a polyethylene bag followed by a metal bag directly after annealing process. These bags preferably are not opened until the lamp is ready for until ready for assembly.

Figure 3:
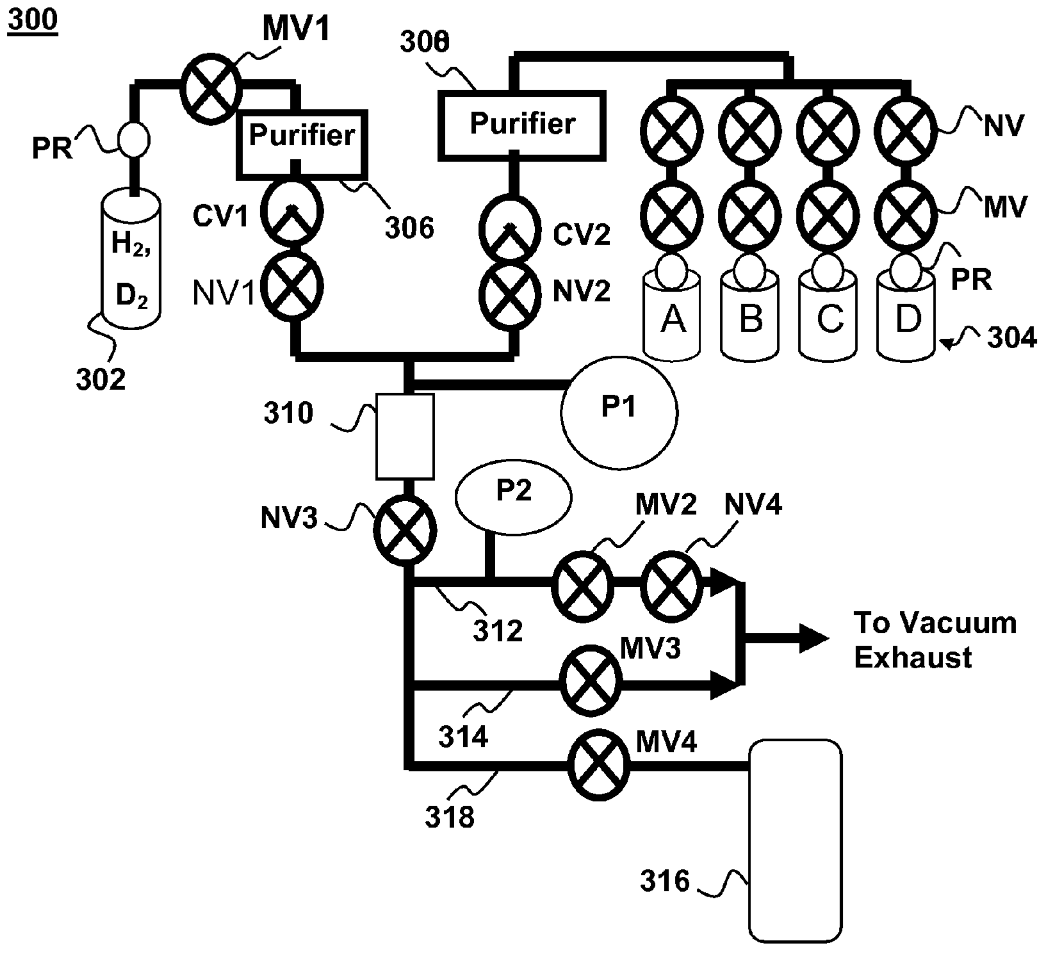
FIG. 3 is a schematic diagram of an ultra-high purity gas handling system for use in filling discharge lamps with high purity gas according to embodiments of the present invention.

In addition, it is useful to fill the lamp enclosure with the gas mixture using a high purity gas filling system that is capable of delivering very low levels of contaminants (e.g., 1-2 ppb to ppt purity). FIG. 3 depicts a schematic diagram of an ultra-high purity gas handling system 300 that can be used in conjunction with filling the lamp. Lamps of the types described herein may have the gas mixture permanently sealed within the lamp housing. Alternatively, the lamp housings may be designed such that the gas mixture can be refilled.

The gas handling system 300 may be part of the wafer inspection or lithography system (but it need not be).

The system 300 generally includes gas sources 302, 304 coupled to gas purifiers 306, 308. The gas purifiers preferably use heater getter technology such as that used by SAES Pure Gas Inc. of San Luis Obispo, Calif. or equivalent technologies used by other vendors. By way of example, the gas purifiers 306, 308 may use heater getter technology such as heater getter purifiers model number PS3-MT3-R2 for rare gases and for H2 and D2 PS3-MT3-H as well as PS11-MC1-H/R purifiers available for SAES Pure Gas, Inc. In this example, the gas source 302 supplies $H_2$ or $D_2$ gas. A pressure regulator PR and manual valve MV1 are coupled between the gas source 302 and the purifier 306. The gas sources 304 may supply different high-purity mixed gases A, B, C, D, e.g., He, Ar, $N_2$, Xe, Kr, etc. These gas sources 304 may be coupled to the purifier 308 through a regulators PR, manual valves MV and needle valves NV.

Preferably, the purifiers 306, 308 are capable of filtering the gases to very high levels of purity, e.g., very low parts per billion to parts-per-trillion levels. The purifiers 306, 308 are respectively coupled through check valves CV1, CV2 and needle valves NV1, NV2 to a sample cylinder 310, which provides a buffer volume for the resulting gas mixture. A first pressure gauge P1 is coupled to the gas line between a juncture between the sample cylinder 310 and the needle valves NV1, NV2. The sample cylinder 310 is connected to a needle valve NV3, which is in turn connected to a vacuum exhaust via first and second exhaust gas lines 312, 314 and to a lamp 316 (e.g., of the types shown in FIG. 1 and FIG. 2) through a gas fill line 318. In the first exhaust gas line 312 a second pressure gauge P2 is coupled between the needle valve NV3 and a manual valve MV2. Another needle valve NV4 is coupled between the manual valve MV2 and the vacuum exhaust. The second exhaust gas line 314 provides a bypass of the needle valve NV4 through a manual valve MV3. Another manual valve MV4 in the gas fill line 318 allows isolation of the lamp from the gas fill system 300.

To achieve a high purity, UHV compatible gas supply, it is desirable to use electro polished stainless steel and ultra high purity fitting, valves, gas lines and other components. Before use, all stainless steel lines in the high purity gas filling system 300 are flushed with a high purity purge gas such as Ar, Xe, $N_2$, He, etc. The purity of the purge and other gases used in the system 300 may initially be about 99.9995% at the input source. After the gases go through the purifier 306 or 308 (e.g., heater getter), the purity may be at part-per-trillion (ppt) levels. The purge gas used for flushing may also be at ppt levels. Ar is a preferred purge gas. Flushing with Ar a minimum of 10 to 50 vol. exchanges is recommended. Preferably, the gas fill line 318 has a small continuous flow while connecting lamp to high purity system.

The lamp 316 may be heated with a flame and flushed with filling gas, e.g., a minimum of 50 volumes exchanges with filling gas. Alternatively, the lamp 316 may be placed into a vacuum oven and annealed for ~1 hour at 1000 C or above is desired. After cooling, the lamp may be backfilled with high purity Ar or filling gas. After annealing or flame heating, the lamp 316 may be filled with filling gas to desired pressure It is important to note that embodiments of the present invention that utilize discharge lamps adapted for UHV-compatible operation, the gas mixture need not necessarily include hydrogen and/or deuterium. The gas mixture may include argon, neon, xenon, or nitrogen in addition to or in lieu of hydrogen and/or deuterium.

Figure 4:
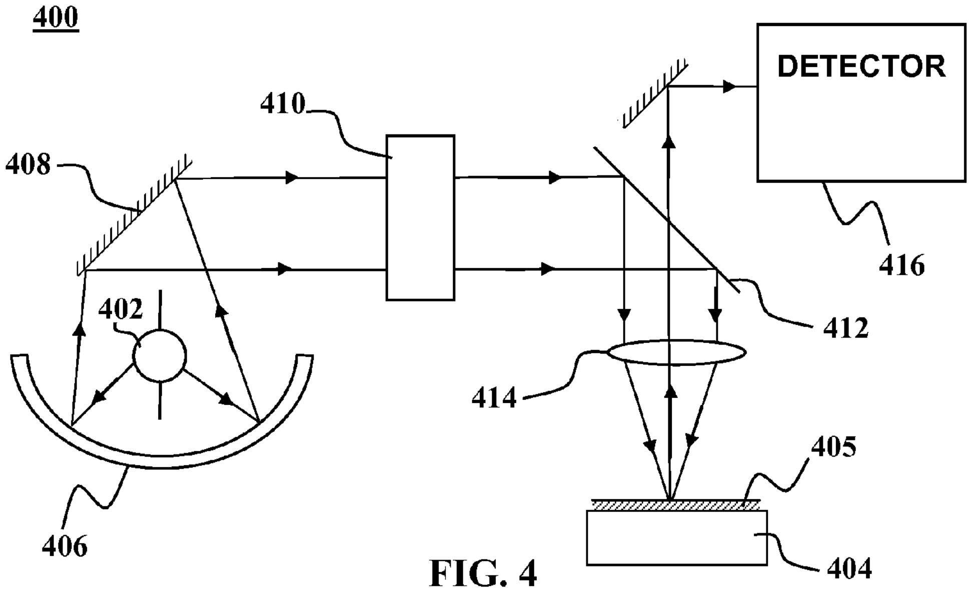
FIG. 4 is a schematic diagram of a wafer inspection system according to an embodiment of the present invention.

Embodiments of the present invention are particularly useful for substrate processing systems. In particular, wafer inspection systems and lithography systems are examples of substrate processing systems that can benefit from broadband light sources based on gas discharges that use hydrogen or deuterium in the discharge gas mixture. By way of example, FIG. 4 depicts a first example of a wafer inspection system 400 according to an embodiment of the present invention. The wafer inspection system 400 generally includes a broadband discharge lamp 402, a substrate support 404 located outside the discharge lamp, and optics adapted to couple ultraviolet light from the discharge lamp to a substrate located on the substrate support. In this example, the optics include an aspheric reflector 406, a plane mirror 408, one or more optical filters 410, a beamsplitter 412, and a focusing lens 414.

The discharge lamp 402 includes an enclosure having one or more walls, at least one of which is at least partly transparent. A gas mixture including hydrogen and/or deuterium is contained within the enclosure. A plasma discharge mechanism adapted to maintain a plasma discharge of the gas mixture that takes place within the enclosure. By way of example and without limitation, the discharge lamp 402 may be as described above with respect to FIG. 1 or FIG. 2. The use of hydrogen and/or deuterium in the gas discharge provides a broad band spectrum of radiation including radiation at vacuum wavelengths below 260 nanometers. Such a broad band light source is highly desirable for use in wafer inspection systems since otherwise two different lamps covering different portions of the desired spectrum might have to be used.

Broadband radiation from the discharge lamp 402 is collected by the aspheric reflector 406 and reflected by the plane mirror 408 through the filters 410 to the beamsplitter 412. The beamsplitter reflects at least a portion of the filtered broadband light to the focusing lens, which focuses the filtered broadband light onto a substrate 405 located on the substrate support 404. The substrate support 404 may be a chuck of a type commonly used for retaining substrates such as semiconductor wafers. Such supports include vacuum chucks and electrostatic chucks. Some of the filtered broadband light scatters off the surface of the substrate 305 back through the focusing lens 414 to the beamsplitter 412. A portion of the scattered broadband light passes through the beamsplitter 412 and is collected by a detector 416, e.g., a time delay integration (TDI) detector. Analysis of a signal from the detector determines the presence or absence of defects on the substrate. Examples of such surface inspection systems are described in commonly assigned U.S. Pat. Nos. 6,816,249 and 6,288,780, the disclosures of both of which are incorporated herein by reference.

Figure 5:
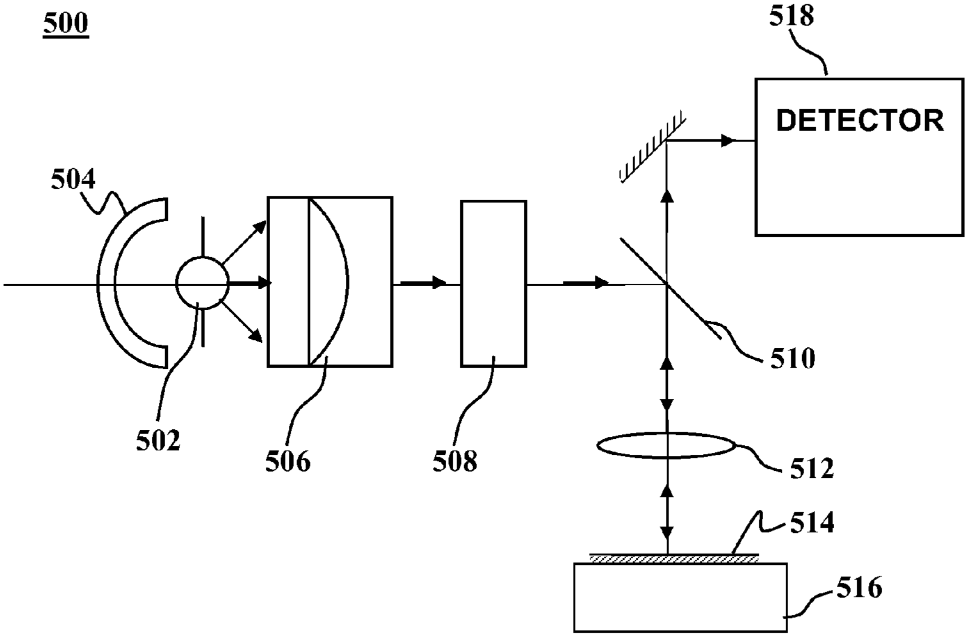
FIG. 5 is a schematic diagram of a wafer inspection system according to an alternative embodiment of the present invention.

FIG. 5 depicts an alternative design for a wafer inspection system 500 according to an embodiment of the present invention. As in the system 400 of FIG. 4, the system 500 uses a broadband gas discharge light source 502 that uses hydrogen and/or deuterium in the discharge gas. By way of example and without limitation, the discharge lamp 502 may be as described above with respect to FIG. 1 or FIG. 2. A curved mirror 504 and condenser lens 506 focuses and collimate broadband light from the discharge source 502. The broadband light passes though a filter 508 and is reflected off a beamsplitter 510 and focused by an objective lens 512 onto the surface of a substrate 514 that rests on a substrate support 516. Some of the radiation scattered from the surface of the substrate 514 passes back through the beamsplitter 510 and is collected by a detector 518, e.g., a TDI detector.

The collection angle (sometimes referred to as Entendue), i.e., the solid angle of a detector or system pupil as seen by the source for the system 500 is preferably between about 0.4 steradian·mm$^2$ and about 1 steradian·mm$^2$. Those of skill in the art will recognize that the solid angle depends on the shape of the source, the width of the source and its numerical aperture (NA). In the case of a source of the type depicted in FIG. 1, the size of the source depends partly on the cone angle α. A sharper cone angle typically produces a narrower, and therefore brighter, source. In the case of a source of the type depicted in FIG. 2, the magnetic confinement of the plasma discharge controls the size of the source. The numerical aperture is defined as the sine of the vertex angle of the largest cone of meridional rays that can enter or leave an optical system or element, multiplied by the refractive index of the medium in which the vertex of the cone is located. Numerical aperture is generally measured with respect to an object or image point, and will vary as that point is moved.

Figure 6:
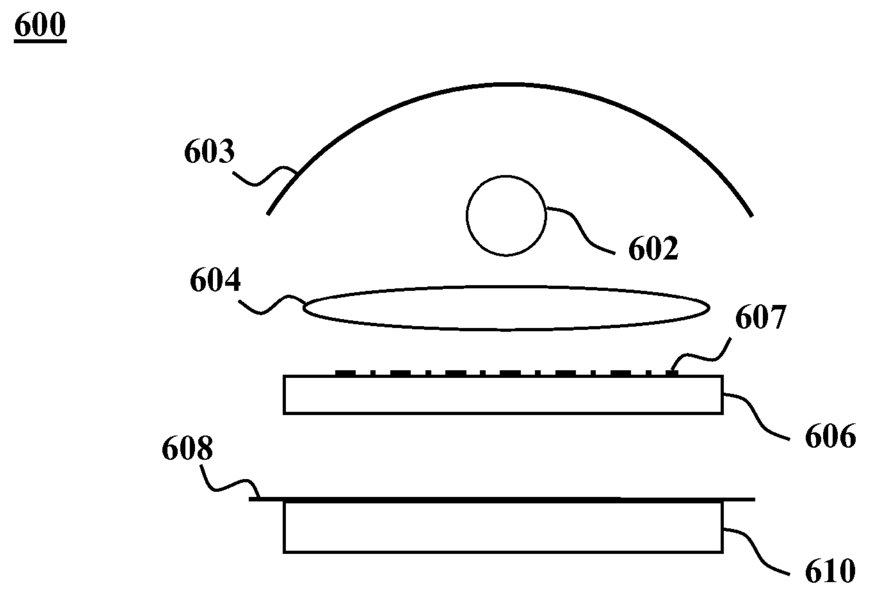
FIG. 6 is a schematic diagram of a photolithography system according to another alternative embodiment of the present invention.

FIG. 6 depicts an example of a photolithography system 600 according to an embodiment of the present invention. The system 600 generally includes a gas discharge lamp 602 a lens 604, a reticle 606 and a substrate 608.

The gas discharge lamp 602 includes an enclosure having one or more walls, at least one of which is at least partly transparent. A gas mixture including hydrogen and/or deuterium is contained within the enclosure. A plasma discharge mechanism adapted to maintain a plasma discharge of the gas mixture that takes place within the enclosure. By way of example and without limitation, the discharge lamp 602 may be as described above with respect to FIG. 1 or FIG. 2.

Broadband light from the light source 602 is collected by an optional reflector 603 and focused with a lens 604 through the reticle 606 onto a substrate 608 that is held by the support 610. The reticle 606 is a substrate, e.g., made of glass or quartz, bearing a pattern 607 in the form of the image of a portion of an integrated circuit. This pattern is focused onto the surface of the substrate 608. The substrate 608 is typically covered with a photoresist that reacts when exposed to radiation. Portions of the photoresist that are exposed to the radiation react with light such that they are either easily removed (for a positive resist) or resistant to removal (for a negative resist), e.g., by a solvent. After removal of portions of the resist, a reduced image of the mask pattern is transferred to the photoresist. Portions of the substrate 608 may then be etched through openings in the pattern on the photoresist. Alternatively, material may be deposited onto the substrate 608 through the openings in the photoresist.

The size of the features that can be formed by photolithography is limited by diffraction. As successive generations of integrated circuits require smaller and smaller circuit features, shorter wavelengths of radiation must be used. The use of hydrogen and/or deuterium in the gas discharge provides a broad band spectrum of radiation including radiation at vacuum wavelengths below 260 nanometers. Such a broad band light source is highly desirable for use in lithography systems since smaller design rules require the use of shorter wavelengths of light for photolithography.

The collection angle for the system 600 is preferably between about 3 steradian·mm$^2$ and about 3400 steradian·mm$^2$. In the case of a lithography system, the collection angle is the solid angle subtended by the ring pupil of the source or system times the area of the mask.

While the above is a complete description of the preferred embodiment of the present invention, it is possible to use various alternatives, modifications and equivalents. For example, microwave discharges may be used as possible alternatives to the discharge mechanisms described above. Any feature, whether preferred or not, may be combined with any other feature, whether preferred or not. Therefore, the scope of the present invention should be determined not with reference to the above description but should, instead, be determined with reference to the appended claims, along with their full scope of equivalents.

In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for exposing a substrate to broadband radiation, comprising the steps of:

supplying a gas mixture containing hydrogen and/or deuterium and/or helium and/or neon and/or nitrogen to an enclosure generating a plasma inside the enclosure with the gas mixture;

magnetically confining the plasma discharge to a small volume within the enclosure; and optically coupling broadband radiation generated in the small volume as a result of the plasma discharge to a substrate located outside the enclosure.

2. The method of claim 1, further comprising the step of analyzing a portion of the broadband radiation that is scattered from a surface of the substrate.

3. The method of claim 1 wherein optically coupling the broadband to the substrate includes focusing the broadband radiation through a reticle to form an image of a pattern on the reticle on the substrate.

4. The method of claim 1 wherein a total pressure of the gas mixture is between about 1 atmosphere and about 15 atmospheres.

5. The method of claim 4 wherein the total pressure of the gas mixture is between about 6 atmospheres and about 12 atmospheres.

6. The method of claim 4 wherein a partial pressure of the hydrogen and/or deuterium is between about 1 percent and about 10 percent of the total pressure.

7. The method of claim 1 wherein gas mixture is a mixture of argon with hydrogen and/or deuterium gas.

8. The method of claim 1 wherein the gas mixture is a mixture of mercury vapor and hydrogen and/or deuterium gas.

9. The method of claim 1, wherein the gas mixture is a mixture of xenon and hydrogen and/or deuterium gas.

10. The method of claim 1 wherein the gases in the gas mixture are selected such that the plasma discharge emits electromagnetic radiation having vacuum wavelengths ranging from about 160 nanometers to about 700 nanometers.

11. The method of claim 1 wherein gases in the gas mixture are selected such that the plasma discharge emits electromagnetic radiation having vacuum wavelengths ranging from about 190 nanometers to about 450 nanometers.

12. The method of claim 1, further comprising the step of adapting the enclosure and gas mixture for UHV-compatible operation.

13. The method of claim 1, wherein generating the plasma includes inductively coupling electromagnetic energy to the plasma discharge within the enclosure.

* * * * *